United States Patent
Sano et al.

(10) Patent No.: US 6,984,833 B2
(45) Date of Patent: Jan. 10, 2006

(54) ION IMPLANTER AND METHOD FOR CONTROLLING THE SAME

(75) Inventors: Makoto Sano, Ehime (JP); Michiro Sugitani, Ehime (JP); Mitsuaki Kabasawa, Ehime (JP); Mitsukuni Tsukihara, Ehime (JP)

(73) Assignee: Sumitomo Eaton Nova Corporation, Tokyo (JP)

( * ) Notice: Subject to any disclaimer, the term of this patent is extended or adjusted under 35 U.S.C. 154(b) by 19 days.

(21) Appl. No.: 10/864,343

(22) Filed: Jun. 10, 2004

(65) Prior Publication Data

US 2004/0251432 A1   Dec. 16, 2004

(30) Foreign Application Priority Data

Jun. 11, 2003   (JP) .............................. 2003/166459

(51) Int. Cl.
  *H01J 37/304*   (2006.01)
  *H01J 37/317*   (2006.01)
(52) U.S. Cl. .............................. 250/492.21; 250/492.2; 250/492.23; 250/252.1; 250/397; 250/398
(58) Field of Classification Search ........... 250/492.21, 250/492.2, 492.1–3, 252.1, 397, 398, 492.3; 298/397, 398
See application file for complete search history.

(56) References Cited

U.S. PATENT DOCUMENTS

| 4,539,217 | A | * | 9/1985 | Farley | 427/10 |
| 4,587,433 | A | * | 5/1986 | Farley | 250/492.2 |
| 5,760,409 | A | * | 6/1998 | Chen et al. | 250/492.21 |
| 5,814,823 | A | * | 9/1998 | Benveniste | 250/492.21 |
| 5,998,798 | A | * | 12/1999 | Halling et al. | 250/492.21 |
| 6,020,592 | A |   | 2/2000 | Liebert |  |
| 6,297,510 | B1 | * | 10/2001 | Farley | 250/492.21 |
| 6,323,497 | B1 | * | 11/2001 | Walther | 250/492.21 |
| 6,523,695 | B1 | * | 2/2003 | Ueta et al. | 267/136 |
| 6,616,898 | B2 | * | 9/2003 | Hara et al. | 422/112 |

(Continued)

FOREIGN PATENT DOCUMENTS

EP   0 854 494 A2   7/1998

(Continued)

OTHER PUBLICATIONS

International Publication No. WO 02/025722 A3; published Mar. 28, 2002.

*Primary Examiner*—John R. Lee
*Assistant Examiner*—Bernard E. Souw
(74) *Attorney, Agent, or Firm*—Arent Fox PLLC

(57) ABSTRACT

The present invention is applied to an ion implanter provided with a vacuum pressure compensation mechanism. The pressure compensation mechanism samples measured beam currents and vacuum pressures in the vicinity of wafers in preliminary implantation and stores function parameters in a memory unit which are obtained by calculating parameters of a predetermined function by fitting the relationship between the measured beam currents and the vacuum pressures. In actual implantation, the pressure compensation mechanism corrects the measured beam current using the function parameters stored as a function of the vacuum pressure, and based on the corrected beam current, the dosage control is performed. In the present invention, an actual beam loss is compensated for based on the estimation from a pressure in the vicinity of the wafers in a region downstream of a mass analysis slit.

24 Claims, 9 Drawing Sheets

U.S. PATENT DOCUMENTS

| | | | |
|---|---|---|---|
| 6,657,209 B2 * | 12/2003 | Halling | 250/492.21 |
| 6,797,967 B1 * | 9/2004 | Tse et al. | 250/492.21 |
| 2002/0130277 A1 * | 9/2002 | Halling | 250/492.21 |
| 2004/0022694 A1 * | 2/2004 | Hara et al. | 422/112 |
| 2004/0251432 A1 * | 12/2004 | Sano et al. | 250/492.21 |

FOREIGN PATENT DOCUMENTS

| | | |
|---|---|---|
| EP | 1 047 103 A2 | 10/2000 |
| JP | 10-2226880 | 8/1998 |
| JP | 2000-11942 | 1/2000 |

* cited by examiner

ION IMPLANTER AND METHOD FOR CONTROLLING THE SAME

The present application claims priority to prior Japanese patent application JP 2003-166459 filed on Jun. 11, 2003, the disclosure of which is incorporated herein by reference.

BACKGROUND OF THE INVENTION

The present invention relates to ion implanters and methods for controlling the same.

Ion implanters have been used in a process for manufacturing semiconductor integrated circuits and are able to implant impurities into finely defined regions on a surface of a semiconductor substrate with good accuracy. In the ion implanters described above, an implanting amount (dosage) of impurity ions per unit area is generally obtained by conversion of an ion beam current I detected by a Faraday cup provided at the rear side of wafers. That is, the number N of ions implanted per unit time is represented by the following equation (1).

$$N = I/q \text{ (namely, } I = q \cdot N\text{)} \tag{1}$$

In this equation (1), q indicates the charge per one ion.

In actual ion implantation, by collision of ions with gas atoms (or molecules) remaining inside a vacuum chamber, the change in charge may occur in some cases. When the change in charge occurs, even when the number N of implanting ions is not changed, the q is changed, and as a result, the ion beam current I detected by a Faraday cup is also changed. In general ion implantation, since the dosage is controlled on the assumption that q is constant, when the change in charge occurs, the control of the dosage becomes incorrect.

For example, in Japanese Patent Application Publications (JP-A) Nos. 2000-11942 (Document 1) and 10-226880 (Document 2), an ion implanter has been disclosed which is provided with a function of compensating for the influence caused by the change in charge as described above. The ion implanter disclosed in the above documents is provided with a mechanism called pressure compensation (hereinafter referred to as "$P_{comp}$") mechanism.

In the $P_{comp}$ mechanism, from a current detected by a Faraday cup and a pressure detected in the vicinity of a position at which wafers are irradiated with ion beam, a current is calculated which is to be detected when the change in charge does not occur. This current is a current to be detected when the pressure in the vicinity of the position at which the wafers are irradiated with the ion beam is sufficiently low and is hereinafter called a "real beam current $I_0$". In addition, the current detected by a Faraday cup is hereinafter called a "measured beam current $I_m$." The pressure detected in the vicinity of the position at which the wafers are irradiated with the ion beam is hereinafter called a "measured pressure $P_{measured}$".

Among the measured beam current $I_m$, the real beam current $I_0$, and the measured pressure $P_{measured}$, the following equation (2) is assumed to hold.

$$I_m = I_0 \cdot f(P) \tag{2}$$

In the equation (2), f(P) indicates the function of the measured pressure $P_{measured}$.

In preliminary ion implantation, under the condition in which the ion beam is in a sufficiently stable state, when the beam current $I_m$ is measured while the pressure P is being changed, the function f(P) can be obtained from the following equation (3). The condition in which the ion beam is in a sufficiently stable state is the condition in which the real beam current $I_0$ can be regarded as constant.

$$f(P) = I_m/I_0 \tag{3}$$

In a graph in which the vertical axis represents the measured beam current $I_m$, and the transverse axis represents the measured pressure $P_{measured}$, the real beam current $I_0$ is the intercept of the vertical axis (measured beam current $I_m$) when $P_{measured} = 0$ holds and is assumed to be constant.

In actual ion implantation for production, by the use of the function f(P) represented by the above equation (3), a corrected beam current $I_{Pcomp}$ is calculated in accordance with the following equation (4-1) using a detected measured beam current $I_m$. Subsequently, based on the corrected measured beam current $I_{Pcomp}$ thus calculated, the control of dosage is carried out.

$$I_{Pcomp} = I_m/f(P) \tag{4-1}$$

Hence, as the number N of implanting ions, the following equation (4-2) is obtained from the above equation (1).

$$N = I_{Pcomp}/q \tag{4-2}$$

Hereinafter, the ion implanter disclosed in the above document 2 will be described. This ion implanter has a $P_{comp}$ mechanism that compensates for the influence of the change in charge caused by the interaction between implanting ions and gas atoms (or molecules) remaining inside a vacuum chamber. In this $P_{comp}$ mechanism, the measured beam current $I_m$ is divided by the pressure function f(P) in accordance with the following equation (5), so that the real beam current $I_0$ is calculated which is to be detected when the change in charge does not occur.

$$I_0 = I_m/f(P) \tag{5}$$

Based on theoretical handling in document 2, when the change in charge is assumed that the neutralization only occurs from a monovalent state to a neutral state, in ion implantation by a high current ion implanter, the function f(P) can be formulized by the following equation (6). The ion implantation by a high current ion implanter indicates monovalent ion implantation performed at an energy of 180 KeV or less.

$$f(P) = \exp(-K_1 \cdot P_1) \cdot \exp(-K_2 \cdot P_2) \cdot \exp(-K_3 \cdot P_3) \cdots \tag{6}$$
$$= \prod \exp(-K_i \cdot P_i)$$
$$= \exp\{\Sigma(-K_i \cdot P_i)\}$$

In the above equation, $P_1$, $P_2$, $P_3$, . . . indicate partial pressures of plurality of gas species present inside the vacuum chamber and are obtained by the following equation (7) with respect to a total pressure $P_{AL}$.

$$P_{AL} = \Sigma P_i \tag{7}$$

In addition, $K_1$, $K_2$, $K_3$, . . . are parameters which indicate the tendency of the change in charge of ions with respect to the individual gas species and are each hereinafter called a pressure compensation factor.

In a related ion implanter, in order to simplify the situation, the following two types of gases are assumed to be present.

(a) plasma shower gas, such as Ar or Xe, used for plasma shower introduced for reducing charge-up caused by the ion beam.

(b) photoresist outgas, such as $H_2$, $CO_2$, or $CH_4$, evolved by ion collision from a photoresist mask applied to wafers for forming a circuit pattern.

Accordingly, the equation (6) can be simplified as represented by the following equation (8).

$$f(P) = \exp(-K_A \cdot P_A) \cdot \exp[-K \cdot (P_{AL} - P_A)] \quad (8)$$
$$= \exp[-K_A \cdot P_A - K \cdot (P_{AL} - P_A)]$$

In the above equation (8), $P_A$ indicates a partial pressure of a plasma shower gas, and $P_{AL}$ indicates a total pressure. $(P_{AL} - P_A)$ indicates a partial pressure of a photoresist outgas obtained from the difference between the total pressure and the partial pressure of the plasma shower gas. In addition, $K_A$ indicates a pressure compensation factor for the plasma shower gas, and $K$ indicates a pressure compensation factor for the photoresist outgas.

In ion implantation, since a plasma shower gas flow (typically 3 sccm of Ar) is controlled constant by the use of a massflow controller, the partial pressure $P_A$ of the plasma shower gas is measured right before the implantation and is assumed to be constant thereafter.

In addition, the partial pressure $(P_{AL} - P_A)$ of the photoresist outgas varies with time due to the change in position of ion beam irradiation, depletion of the photoresist outgas, and the like one (see FIG. 2A), and hence the total pressure $P_{AL}$ is measured at regular time intervals during ion implantation, and the measurement is fed back to the $P_{comp}$ mechanism.

An example of calculating the pressure compensation factor $K_A$ for the plasma shower gas will be described with reference to FIG. 1. In this case, ion implantation is performed for bare wafers using Ar as the plasma shower gas at flow rates of 1, 3, and 5 (sccm). As the Ar flow is increased, the decrease in measured beam current $I_m$ is observed. In this case, since the photoresist outgas is not present ($P_{AL} = P_A$), from the equations (5) and (8), the following equation (9-1) can be obtained.

$$I_m = I_0 \cdot f(P) \quad (9-1)$$
$$= I_0 \cdot \exp[-K_A \cdot P_A - K \cdot (P_{AL} - P_A)]$$
$$= I_0 \cdot \exp(-K_A \cdot P_A)$$

Accordingly, the following equation (9-2) is obtained, and $K_A$ is calculated from the slope of a fitting linear line shown in FIG. 1.

$$\ln I_m = \ln I_0 + (-K_A \cdot P_A) \quad (9\text{-}2)$$

In the above equation, In indicates the natural logarithm.

An example will be described with reference to FIGS. 2A to 2C in which ion implantation is performed for wafers provided with a photoresist to obtain the pressure compensation factor K for a photoresist outgas. FIG. 2A shows the time dependence of the total pressure $P_{AL}$ in the vicinity of a position at which the wafers are irradiated with the ion beam, and FIG. 2B shows the time dependence of the measured beam current $I_m$. The increase of the total pressure $P_{AL}$ is caused by outgas evolved from the photoresist. In addition, the periodic change in total pressure $P_{AL}$ is caused by the change in position of the wafers irradiated with ion beam, that is, the irradiation is started, for example, from the bottom end of the wafers and is returned thereto through the center, the top end, and the center of the wafers and is repeated in this manner. The reason the change in total pressure $P_{AL}$ is decreased with time is due to the depletion of the photoresist outgas. The trends of the measured beam current $I_m$ and the total pressure $P_{AL}$ with time are opposite to each other, and the decrease in measured beam current $I_m$ is observed when the total pressure $P_{AL}$ is increased.

FIG. 2C shows the relationship between the total pressure $P_{AL}$ and the natural logarithm of the measured beam current $I_m$, and those can be plotted along an approximately linear line. From the equations (5) and (8), the following equation (10) is obtained.

$$I_m = I_0 \cdot f(P)$$
$$= I_0 \cdot \exp[-K_A \cdot P_A - K \cdot (P_{AL} - P_A)]$$

Accordingly, the following equation holds.

$$\ln I_m = \ln I_0 + [-K_A \cdot P_A - K \cdot (P_{AL} - P_A)] \quad (10)$$
$$= \ln I_0 + [(K - K_A) \cdot P_A - K \cdot P_{AL}]$$

Since the Ar flow is constant, the partial pressure $P_A$ is constant, and from the slope of the fitting linear line shown in FIG. 2C, the pressure compensation factor K can be calculated.

According to the related $P_{comp}$ mechanism, as described above, based on the assumption that the real beam current $I_0$ is constant, the pressure compensation factors $K_A$ and $K$ are obtained from the preliminary ion implantation. Subsequently, in actual ion implantation, by using these pressure compensation factors $K_A$ and $K$, the correction has been performed. A beam current $I_{Pcomp}$ used for the control in actual ion implantation is represented by the following equation (11)

$$I_{Pcomp} = I_m / f(P) \quad (11)$$
$$= I_m \cdot \exp[K_A \cdot P_A + K \cdot (P_{AL} - P_A)]$$

When the beam current $I_{Pcomp}$ is constant (that is, $I_{Pcomp} = I_0$ holds), the equation (11) is equal to the equation (10).

However, in the related ion implanter, the following two problems have occurred.

The first problem is an underdose (deficiency of dosage) phenomenon generated when the pressure in the vicinity of wafers is considerably increased. The considerable increase in pressure in the vicinity of the wafers indicates that the amount of photoresist outgas is very large. The reason for this underdose phenomenon is believed that even though the real beam current $I_0$ is assumed to be constant when the f(P) is calculated, the real beam current $I_0$ itself is actually decreased.

The second problem is that when ion implantation is performed under various conditions, the loads of calculation of the pressure compensation factors $K_A$ and K are increased badly. That is, since the function f(P) is changed whenever the implantation condition, such as ion species and energy, is changed, the function f(P) must be re-measured for each implantation condition. In addition, even the implantation condition is not changed, since the individual variation among ion implanters is present, the function f(P) must be calculated for each ion implanter.

SUMMARY OF THE INVENTION

Accordingly, as for the first problem described above, the reason the real beam current $I_0$ is decreased is analyzed, and based on the results of this analysis, a dose control method was obtained. Hence, an object of the present invention is to provide this dose control method and an ion implanter using the same.

In addition, the present invention provides a dose control method that overcomes the above second problem and an ion implanter using the same. According to the dose control method described above, various data of the function f(P) for a plurality of implanters are systematically sampled, followed by simple adjustment thereof, and hence the pressure compensation factors $K_A$ and K of the function f(P) can be automatically determined for an optional condition and an optional implanter.

In the method for controlling an ion implanter, according to the present invention, ion implantation is performed by irradiating wafers provided on a disc disposed in a vacuum processing chamber with an ion beam generated in an ion source through a mass analysis magnet apparatus and a mass analysis slit. In addition to a current detector measuring a beam current at the rear side of the disc of the vacuum processing chamber as a measured beam current while the disc is rotated, and a pressure detector measuring a vacuum pressure in the vicinity of a position at which the wafers are irradiated with the ion beam, the ion implanter also has a vacuum pressure compensation mechanism. The vacuum pressure compensation mechanism has functions of sampling the measured beam currents and the vacuum pressures under a plurality of conditions in preliminary implantation, fitting the relationship between the sampled measured beam currents and vacuum pressures to a predetermined function, and storing function parameters obtained by calculation of parameters of the function into a memory unit. In the vacuum pressure compensation mechanism, the measured beam currents in actual implantation are corrected using the stored function parameters and a dosage control is performed in accordance with the corrected beam currents.

According to a first aspect of the present invention, in the method for controlling an ion implanter described above, secondary compensation for an actual beam loss is performed based on the estimation from a pressure measured in the vicinity of the position at which the wafers are irradiated with the ion beam in a region downstream of the mass analysis slit. The actual beam loss is caused by a pressure increase of a beam line inside the mass analysis magnet apparatus in a beam deflection and travel zone from an inlet of the mass analysis magnet apparatus to the mass analysis slit.

The ion implanter of the present invention performs ion implantation by irradiating wafers on a disc disposed in a vacuum processing chamber with an ion beam generated in an ion source through a mass analysis magnet apparatus and a mass analysis slit. In addition to a current detector measuring a beam current at the rear side of the disc in the vacuum processing chamber as a measured beam current while the disc is rotated, and a pressure detector measuring a vacuum pressure in the vicinity of a position at which the wafers are irradiated with the ion beam, the ion implanter also has a vacuum pressure compensation mechanism. The vacuum pressure compensation mechanism has functions of sampling the measured beam currents and the vacuum pressures under a plurality of conditions in preliminary implantation, fitting the relationship between the sampled measured beam currents and vacuum pressures to a predetermined function, and storing function parameters obtained by calculation of parameters of the function into a memory unit. In the vacuum pressure compensation mechanism, the measured beam currents in actual implantation are corrected using the stored function parameters and a dosage control is performed in accordance with the corrected beam currents.

According to a second aspect of the present invention, in the ion implanter described above, the vacuum pressure compensation mechanism performs secondary compensation for an actual beam loss based on the estimation from a pressure measured in the vicinity of the position at which the wafers are irradiated with the ion beam in a region downstream of the mass analysis slit. The actual beam loss is caused by a pressure increase of a beam line inside the mass analysis magnet apparatus in a beam deflection and travel zone from an inlet of the mass analysis magnet apparatus to the mass analysis slit.

According to a third aspect of the present invention, in the method for controlling an ion implanter described above, secondary compensation for an actual beam loss is performed by a measured pressure of a beam line inside the mass analysis magnet apparatus in a beam deflection and travel zone, in which the actual beam loss is caused by a pressure increase of the beam line inside the mass analysis magnet apparatus in the beam deflection and travel zone from an inlet of the mass analysis magnet apparatus to the mass analysis slit.

According to a fourth aspect of the present invention, in the ion implanter described above, the vacuum pressure compensation mechanism performs secondary compensation for an actual beam loss by a measured pressure of a beam line inside the mass analysis magnet apparatus in a beam deflection and travel zone, in which the actual beam loss is caused by a pressure increase of the beam line inside the mass analysis magnet apparatus in the beam deflection and travel zone from an inlet of the mass analysis magnet apparatus to the mass analysis slit.

According to a fifth aspect of the present invention, in the method for controlling an ion implanter described above, secondary compensation for an actual beam loss is performed by the analysis of a measured pressure at an optional position in a beam line, in which the actual beam loss is caused by a pressure increase of the beam line inside the mass analysis magnet apparatus in the beam deflection and travel zone from an inlet of the mass analysis magnet apparatus to the mass analysis slit.

According to a sixth aspect of the present invention, in the ion implanter described above, the vacuum pressure compensation mechanism performs secondary compensation for an actual beam loss by the analysis of a measured pressure at an optional position in a beam line, in which the actual beam loss is caused by a pressure increase of the beam line inside the mass analysis magnet apparatus in the beam deflection and travel zone from an inlet of the mass analysis magnet apparatus to the mass analysis slit.

According to a seventh aspect of the present invention, in the method for controlling an ion implanter described above, pressure compensation factors for a plasma shower gas are always stored in a memory unit as table values and are automatically read out in accordance with an implantation condition.

According to an eighth aspect of the present invention, in the ion implanter described above, the vacuum pressure compensation mechanism is configured so that pressure compensation factors for a plasma shower gas are always stored in a memory unit as table values and are automatically read out in accordance with an implantation condition.

According to a ninth aspect of the present invention, in the method for controlling an ion implanter described above, pressure compensation factors for a photoresist outgas are always stored in a memory unit as table values and are automatically read out in accordance with an implantation condition.

According to a tenth aspect of the present invention, in the ion implanter described above, the vacuum pressure compensation mechanism is configured so that pressure compensation factors for photoresist outgases are always stored in a memory unit as table values and are automatically read out in accordance with an implantation condition.

According to an eleventh aspect of the present invention, in the method for controlling an ion implanter described above, pressure compensation factors for a plasma shower gas and photoresist outgases are always stored in a memory unit as table values and are automatically read out in accordance with an implantation condition.

According to a twelfth aspect of the present invention, in the ion implanter described above, the vacuum pressure compensation mechanism is configured so that pressure compensation factors for a plasma shower gas and photoresist outgases are always stored in a memory unit as table values and are automatically read out in accordance with an implantation condition.

In the control method of an ion implanter, according to the seventh aspect of the present invention, a standard value of the pressure compensation factors for the plasma shower gas stored as the table values are prepared, the difference in pressure compensation factor caused by individual variation of a plurality of the ion implanters are adjusted, and the table values of the pressure compensation factors for the individual ion implanters are made.

In the control method of an ion implanter, according to the ninth aspect of the present invention, a standard value of the pressure compensation factors for the photoresist outgases stored as the table values are prepared, the difference in pressure compensation factor caused by individual variation of a plurality of the ion implanters are adjusted, and the table values of the pressure compensation factors for the individual ion implanters are made.

In the control method of an ion implanter, according to the eleventh aspect of the present invention, standard values of the pressure compensation factors for the plasma shower gas and the photoresist outgases stored as the table values are prepared, the difference in pressure compensation factor caused by individual variation of a plurality of the ion implanters are adjusted, and the table values of the pressure compensation factors for the individual ion implanters are made.

In the control method of an ion implanter, according to the first aspect of the present invention, a factor $\alpha$ is always store as a table value in a memory unit and is automatically read out in accordance with an implantation condition, in which the factor $\alpha$ reflects the actual beam loss caused by the pressure increase of the beam line inside the mass analysis magnet apparatus in the beam deflection and travel zone from the inlet of the mass analysis magnet apparatus to the mass analysis slit.

In the control method of an ion implanter, according to the ninth or eleventh aspect of the present invention, a factor $\beta$ is always stored as a table value in a memory unit and is automatically read out in accordance with the implantation condition, in which the factor $\beta$ adjusts the pressure compensation factor for the photoresist outgas depending on the beam current.

In the control method of an ion implanter, according to one of the first, third, and fifth aspects of the present invention, the pressure measurement may be performed by the steps of measuring the pressure in the vicinity of the position at which the wafers are irradiated with ion beam and of the pressure increase inside the mass analysis magnet apparatus at a plurality of places, and calculating the weighted average of the measurement results in consideration of the conductance of vacuum chambers and the exhaust speed of vacuum pumps.

In the control method of an ion implanter, according to one of the first, third, and fifth aspects of the present invention, the disc may have a plurality of slits so that the beam current is measured at least twice per one rotation of the disc.

In the control method of an ion implanter, according to one of the first, third, and fifth aspects of the present invention, the disc may have at least one slit so that the beam current is measured once per one rotation of the disc.

In the control method of an ion implanter, according to one of the first, third, and fifth aspects of the present invention, the disc may have at least one slit so that the beam current is measured once per more than one rotation of the disc. Hence, the sampling intervals may be increased.

In the control method of an ion implanter, according to one of the seventh, ninth, and eleventh aspects of the present invention, simulation may be performed in consideration of the conductance of the entire vacuum chambers of the ion implanter and the exhaust speed of the vacuum pumps so as to calculate individual variation of the table values of the pressure compensation factors of a plurality of the ion implanters.

In the control method of an ion implanter, according to one of the seventh, ninth, and eleventh aspects of the present invention, factors for adjusting the influences of other parameters of the implantation condition on the pressure compensation factor may be prepared as a plurality of tables, which other parameters include a beam diameter, a beam current density, and a total dosage, so that the pressure compensation factor is corrected with reference to the plurality of tables as related data before implantation is carried out.

In the control method of an ion implanter, according to one of the seventh, ninth, and eleventh aspects of the present invention, factors for adjusting the influences of conditions of a photoresist on the pressure compensation factor may be prepared as a plurality of tables, which conditions of a photoresist include a material, a solvent and the content thereof, and treatment before implantation, so that the pressure compensation factor is corrected with reference to the plurality of tables as related data before implantation is carried out.

According to the aspects and various modifications of the present invention described above, by performing simple adjusting operation beforehand, ion implantation can be performed under an optional condition by an optional ion implanter so as to obtain a highly accurate dosage.

BRIEF DESCRIPTION OF THE DRAWINGS

FIGS. 2A to 2C are graphs for illustrating a general method for calculating a pressure compensation factor K, in which FIG. 2A shows the time dependence of a total pressure $P_{AL}$ of a vacuum chamber of an ion implanter, FIG. 2B shows the time dependence of a measured beam current $I_m$, and FIG. 2C shows the relationship of the measured beam current $I_m$ with the total Pressure $P_{AL}$;

FIGS. 8A and 8B are graphs for illustrating a beam line effect and the correction thereof (deviation of sheet resistance), in which FIG. 8A shows the result obtained from a related ion implanter, and FIG. 8B shows the result obtained from an ion implanter of the present invention;

DESCRIPTION OF THE PREFERRED EMBODIMENTS

Figure 1:
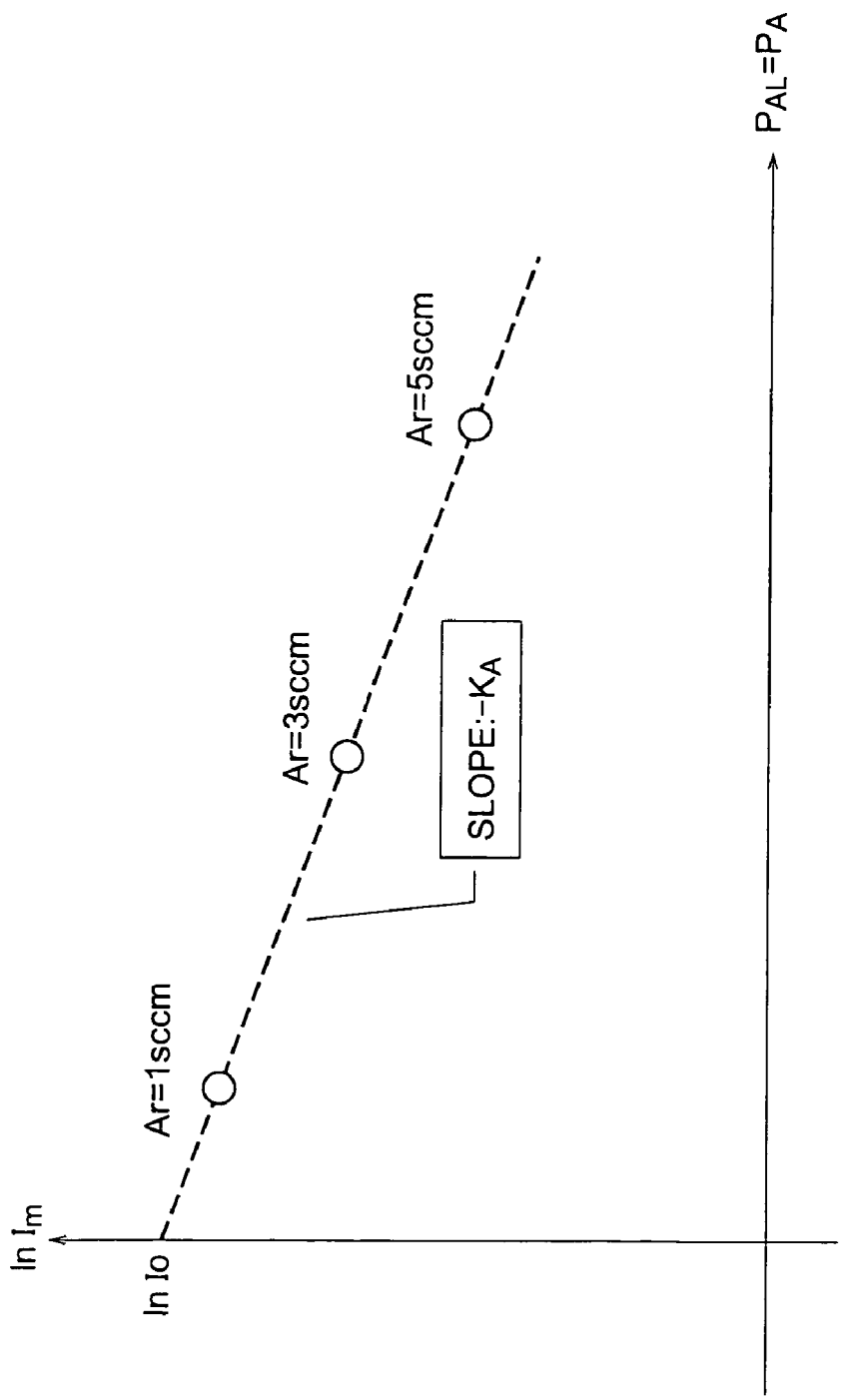
FIG. 1 is a graph for illustrating a general method for calculating a pressure compensation factor $K_A$.
Figure 2A:
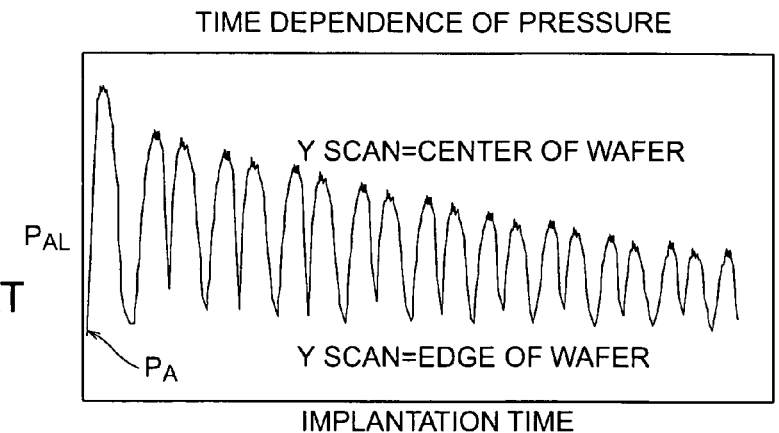
Figure 2B:
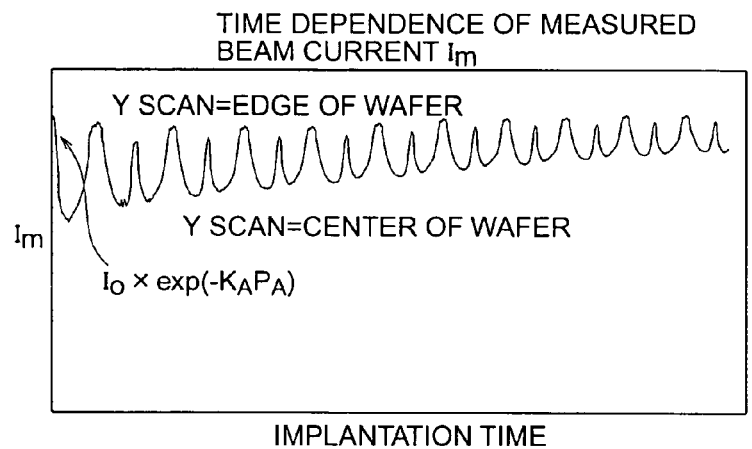
Figure 2C:
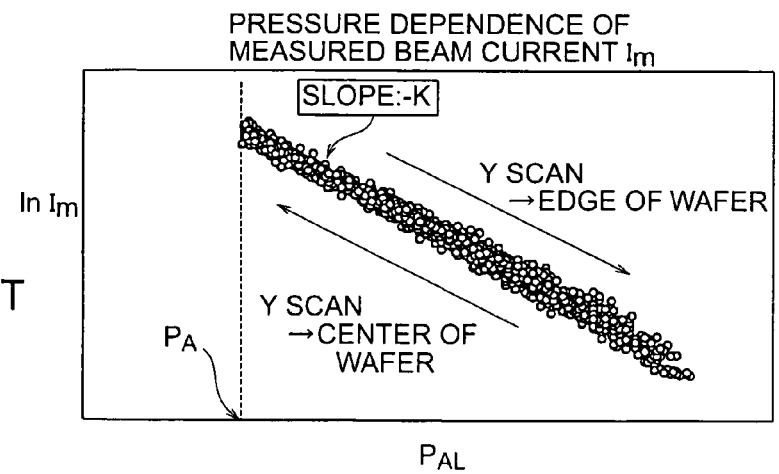
Figure 3:
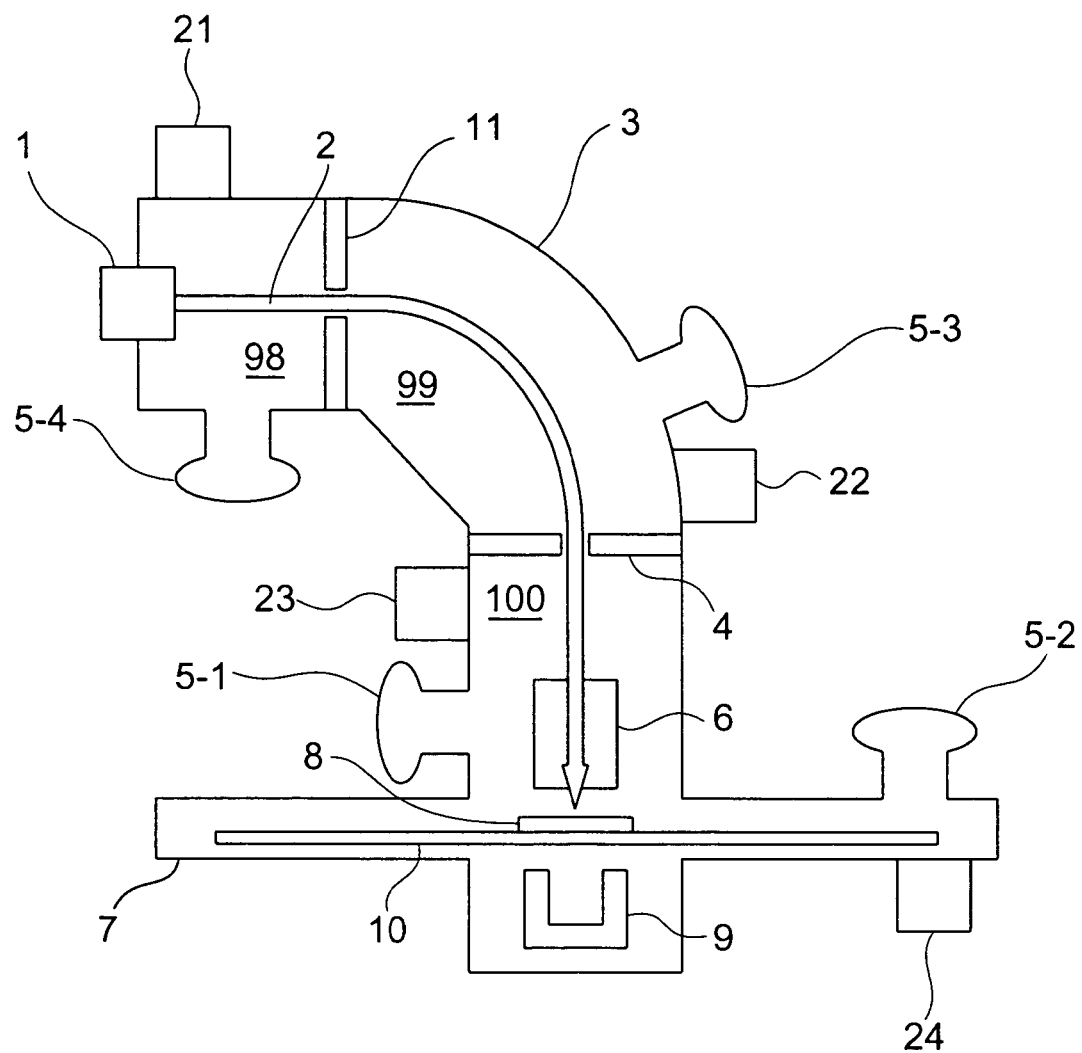
FIG. 3 is a schematic view showing the structure of an ion implanter used for the present invention.

Referring to FIG. 3, the structure of a typical ion implanter used for the present invention will be described. Reference numerals 21, 22, and 23 indicate vacuum pumps provided for vacuum chambers 98, 99, and 100, respectively, for exhausting gases. Reference numeral 24 indicates a vacuum pump provided for an implantation process chamber 7 for exhausting gases. The traveling direction of an ion beam 2 emitted from an ion source 1 is deflected by a mass analysis electromagnet apparatus 3, and mass analysis is performed by a mass analysis slit 4. The ion beam 2 passing through the mass analysis slit 4 is implanted into a wafer 8 in the implantation process chamber 7. In addition, at the inlet of the mass analysis electromagnet apparatus 3, a partition plate 11 having an aperture used as an ion beam path is provided. In addition, in the vacuum chamber 100 located between the mass analysis slit 4 and the implantation process chamber 7, a plasma shower 6 is provided for suppressing charge-up caused by ion implantation. An ion gauge 5-1 is provided in the vicinity of the plasma shower 6 and the wafer 8, and ion gauges 5-2, 5-3, and 5-4 are provided in the implantation process chamber 7, the mass analysis electromagnet apparatus 3, and the vacuum chamber 98, respectively.

As typical values, the volume of the implantation process chamber 7 is 500 liters, the effective exhaust speed of the vacuum pumps 23 and 24 is approximately 5,000 liter/sec, and the time constant V/S of the pressure change inside the implantation process chamber 7 is approximately 0.1 seconds. Since this time constant reflects the time delay of pressure change inside the implantation process chamber 7 caused by outgas evolved from the wafer 8, for improving the accuracy of a $P_{comp}$ mechanism, the time constant is preferably decreased as small as possible. That is, as the volume of the implantation process chamber 7 is decreased, the accuracy of the $P_{comp}$ mechanism is improved.

Figure 4:
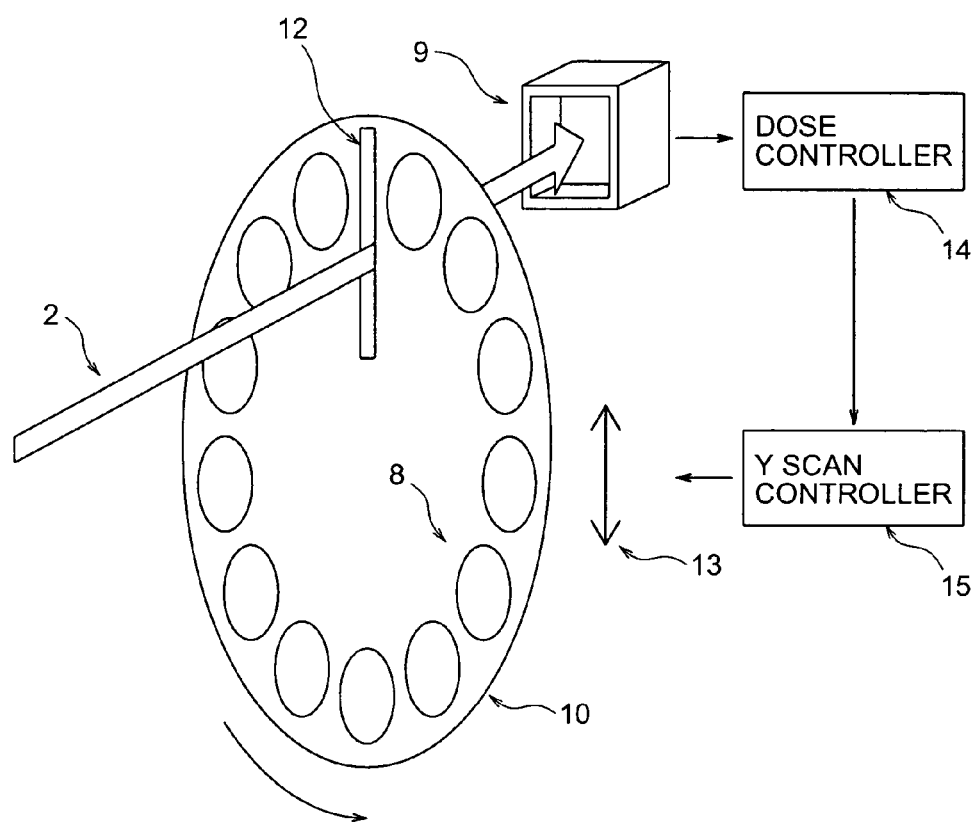
FIG. 4 is a schematic view for illustrating dose control of a batch type ion implanter.

In general, in a batch type ion implanter, as shown in FIG. 4, a plurality of wafers 8 is disposed on a disc 10 along the circumference thereof at regular intervals, and ion implantation is performed for the wafers 8 while the disc 10 is rotated at a high rotation speed. In this step, the beam current is measured by a Faraday cup 9 provided downstream of the disc 10. In addition, the disc 10 is configured to reciprocate in the diameter direction thereof indicated by an arrow 13 by a Y scan controller 15.

As one example of the batch type ion implanter, a slit 12 is provided in a part of the disc 10. Since the ion beam 2 reach the Faraday cup 9 through the slit 12, the measurement of the beam current can be performed once per one rotation of the disc 10. In addition, the measurement of the beam current may be performed once per more than one rotation of the disc 10. Since the rotation speed of the disc 10 is approximately 800 to 1,250 (rpm), the interval of the measurement of beam current is approximately 75 to 48 (msec). Of course, in stead of one measurement of the beam current per one rotation of the disc 10, by providing at least two slits therein, more than one measurement may be performed per one rotation of the disc 10.

Figure 5:
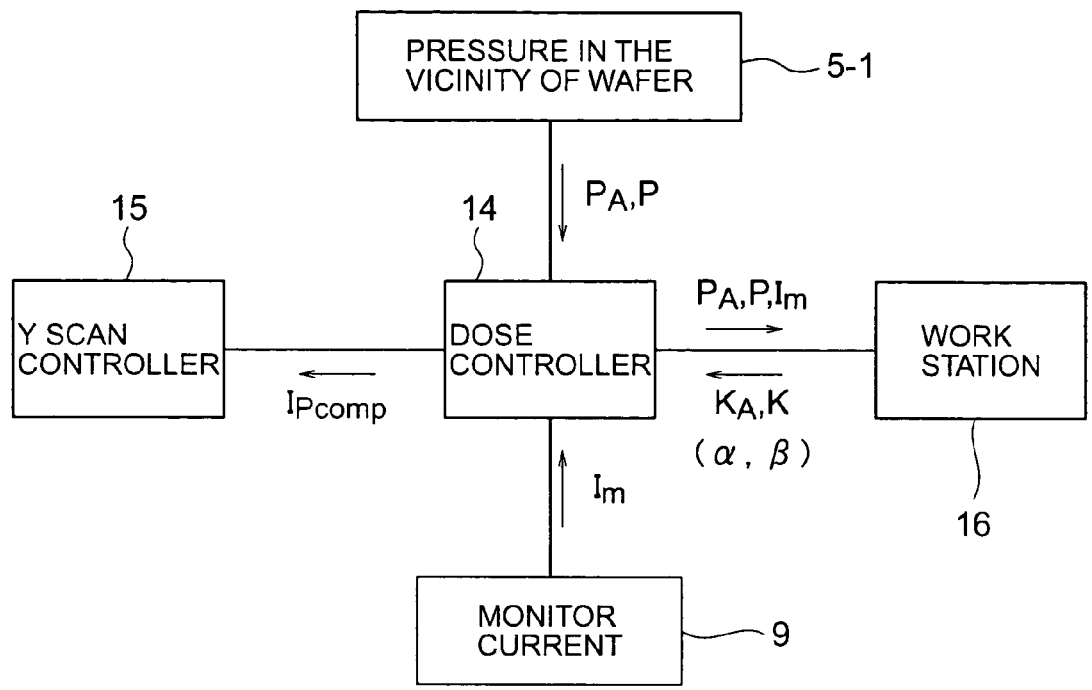
FIG. 5 is a schematic diagram showing the structure of a dose control system of the present invention.

The pressure in the vicinity of the wafers is measured by the ion gage 5-1. As shown in the structure of a dose control system in FIG. 5, the beam current and the pressure are stored once per n rotations (n is from 1 to 100) in a memory unit of a work station 16. In the pressure measurement, it is possible to refer the pressures measured by the ion gages 5-2, 5-3, or 5-4.

When the beam current measured by the Faraday cup 9 and the pressure in the vicinity of the wafers measured by the ion gage 5-1 are represented by $I_m$ and $P_{AL}$, respectively, a beam current $I_{Pcomp}$ used for the dose control is calculated by the following equation (12).

$$I_{Pcomp}=I_m \cdot \exp[K_A \cdot P_A + K \cdot (P_{AL} - P_A)] \quad (12)$$

In the equation (12), $P_A$ represents a pressure increased by a plasma forming gas during the use of the plasma shower 6, and after the measurement is performed immediately before ion implantation, $P_A$ is assumed constant during ion implantation. $(P_{AL}-P_A)$ represents a partial pressure of a photoresist outgas. $K_A$ and K represent the pressure compensation factors for the plasma shower gas and the photoresist outgas, respectively. After receiving the pressure $P_{AL}$ in the vicinity of the wafers from the ion gage 5-1, the beam current $I_m$ from the Faraday cup 9, and the pressure compensation factors $K_A$ and K from the work station 16, a dose controller 14 calculates the beam current $I_{Pcomp}$ in accordance with the equation (12). In accordance with the result obtained from the calculation, the dose controller 14 controls the speed of the reciprocal linear motion indicated by the arrow 13 (see FIG. 4) of the disc 10 via the Y scan controller 15, and as a result, the ion implantation dosage into the wafer 8 is controlled.

In the present invention, in order to improve the accuracy of the $P_{comp}$ mechanism and to easily set the pressure compensation factors, (I) correction of an underdose phenomenon, and (II) configuration of an automatic setting system of the pressure compensation factors $K_A$ and K were carried out. First, the above (I) will be described.

(I) Correction of Underdose Phenomenon Caused by Pressure Increase due to Photoresist Outgas In a related $P_{comp}$ mechanism, the pressure increase inside the mass analysis electromagnet apparatus 3 was regarded as sufficiently small, and hence the influence of this pressure increase has been ignored. However, when the pressure increase caused by the photoresist outgas became large, the influence thereof could not be ignored, and as a result, the underdose phenomenon was observed due to the beam loss which occurred inside the mass analysis electromagnet apparatus 3. This underdose phenomenon may cause dose deviation and non-uniformity of ion dosage and is called a "beam line effect" in some cases. This beam line effect will be influenced, for example, by the volumes of the implantation process chamber 7 and the vacuum chamber 99 of the mass analysis electromagnet apparatus 3, the shapes thereof, the exhaust capacities of the vacuum pumps 21 to 24 provided as described above, and the shape of the mass analysis slit 4.

Figure 6:
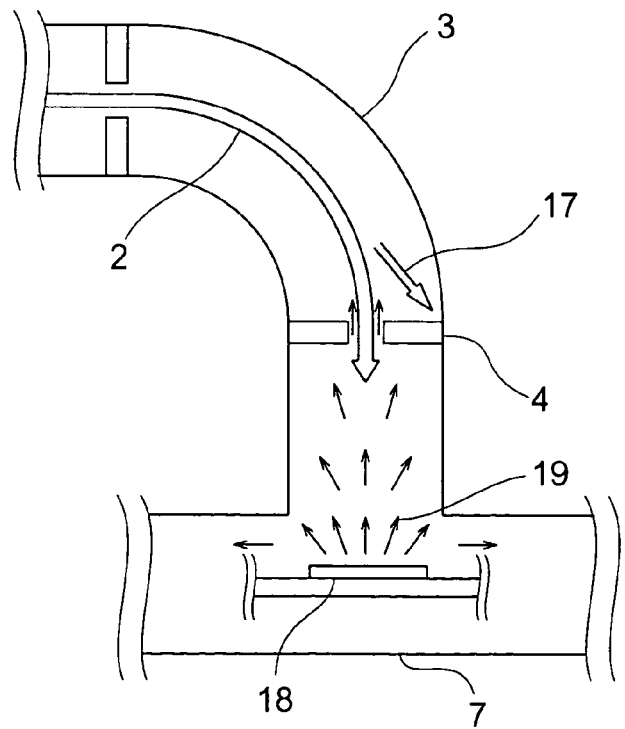
FIG. 6 is a schematic view for illustrating a beam line effect of an ion implanter.

FIG. 6 is a schematic view for illustrating the beam line effect.

When ion implantation is performed for a wafer 18 provided with a photoresist, due to an outgas 19 out of the photoresist, the pressure inside the mass analysis electromagnet apparatus 3 may be increased in some cases. The change in charge of the ion beam 2 may occur in the mass analysis electromagnet apparatus 3 by this photoresist outgas 19, and as a result, a part 17 of the ion beam 2 may be lost in the mass analysis electromagnet apparatus 3 in some cases. When the magnetic flux density inside the mass analysis electromagnet apparatus 3, the weight of ion, the velocity, and the charge are represented by B, m, v, and q, respectively, a curvature radius R of the ion beam orbit in the mass analysis electromagnet apparatus 3 can be represented by the following equation (13).

$$R=(m \cdot v)/(q \cdot B) \tag{13}$$

That is, the curvature radius R changes when the charge q changes, and hence the ions cannot pass through the mass analysis slit 4 since the ion beam orbit is changed. This phenomenon indicates that the number of impurity particles which reach the wafer 18 provided with a photoresist is decreased. When the pressure compensation factor K is first calculated in a related $P_{comp}$ mechanism, the calculation is performed based on the assumption that the number of impurity particles which reach the wafer 18 provided with a photoresist is constant. Hence, when the related $P_{comp}$ mechanism is used under the condition described above, the number of impurity particles is overestimated than that actually present, and as a result, the underdose phenomenon occurs.

Since the actual number of particles ($I_{wafer}$: current converted value), which reach the wafer 18 provided with a photoresist through the mass analysis slit 4 without any change in charges in the mass analysis electromagnet apparatus 3, can be obtained in the same manner as the theoretical equation for the $P_{comp}$ mechanism, the following equation (14) holds.

$$I_{wafer} = I_0 \cdot \exp[-K'_A \cdot P_A - K' \cdot (P_{AL} - P_A)] \tag{14}$$
$$= I_0 \cdot \exp[-K'_A \cdot P_A] \cdot \exp[-K' \cdot (P_{AL} - P_A)]$$

In the above equation, $I_0$ is a beam current reflecting the number of particles which reach the wafer 18 provided with a photoresist when the pressure is not increased. In addition, $K_A'$ and K' are the pressure compensation factors for the plasma shower gas and the photoresist outgas, respectively, when the beam line effect is taken into consideration.

Since the plasma shower gas flow is constant during ion implantation relatively low, it is believed that the increased pressure is constant and that the amount of increase in pressure is sufficiently small. Based on the assumption described above, the term $\exp[-K_A' \cdot P_A]$ of the above equation (14) may be ignored, and as a result, the equation (14) may be represented as follows.

$$I_{wafer}=I_0 \cdot \exp[-K_A' \cdot (P_{AL}-P_A)] \tag{15}$$

From the equations (10) and (15), the following equation (16) is obtained.

$$I_{wafer} = I_m \cdot \exp[K_A \cdot P_A + K \cdot (P_{AL} - P_A)] \cdot \tag{16}$$
$$\exp[-K' \cdot (P_{AL} - P_A)]$$
$$= I_m \cdot \exp[K_A \cdot P_A + (K - K') \cdot (P_{AL} - P_A)]$$

K and K' are the parameters of ions indicating the tendency of the change in charge and correspond to a charge-change phenomenon at a position downstream of the mass analysis electromagnet apparatus 3 and to that at a position inside thereof, respectively. The charge-change phenomena described above are substantially equal to each other, and hence the following equation (17) is assumed to hold.

$$K \propto K' \tag{17}$$

Accordingly, the following relationship is also satisfied.

$$K'=\alpha \cdot K \tag{18}$$

In the above equation, α is a factor determined by the conductance at positions downstream and inside of the mass analysis electromagnet apparatus 3 and the exhaust speed of the vacuum pumps. In addition, the factor α is changed as the conductance or the exhaust speed of the vacuum pumps is changed due to the change in design of the ion implanter.

From the equations (16) and (18), the following equation (19) is obtained.

$$I_{wafer} = I_m \cdot \exp[K_A \cdot P_A + (K - \alpha \cdot K) \cdot (P_{AL} - P_A)] \tag{19}$$
$$= I_m \cdot \exp[K_A \cdot P_A + K \cdot (1 - \alpha) \cdot (P_{AL} - P_A)]$$

The above equation is equivalent to the equation (12) when K is replaced with K·(1−α).

In addition, when the pressure is extremely increased, a related ion implanter has an open-loop dose control mechanism in which the dose control is performed with reference to a beam current ($I_{openloop}$) at a low pressure. In a $P_{comp}$ mechanism in the past, the beam current $I_{openloop}$ is constant in open-loop dose control (that is, $I_{openloop}=I_0$). On the other hand, according to the novel control system of the present invention, the dose control is performed by a dose controller 14 based on the condition in which the beam current $I_{openloop}$ is also decreased in accordance with the beam line effect caused by a pressure increase. This case will be described with reference to FIG. 7.

From the equation (19), in the case of the open-loop dose control, the following equation (20) holds.

$$I_{openloop} = I_{wafer} \tag{20}$$
$$= I_m \cdot \exp[K_A \cdot P_A + K \cdot (1 - \alpha) \cdot (P_{AL} - P_A)]$$
$$= I_m \cdot \exp[K_A \cdot P_A + K \cdot (P_{AL} - P_A) -$$
$$\alpha \cdot K \cdot (P_{AL} - P_A)]$$
$$= I_m \cdot \exp[K_A \cdot P_A + K \cdot (P_{AL} - P_A)] \cdot$$
$$\exp[-\alpha \cdot K(P_{AL} - P_A)]$$

From the equations (10) and (20), the following equation (21) is obtained.

$$I_{openloop}=I_0 \cdot exp[-\alpha \cdot K \cdot (P_{AL}-P_A)] \quad (21)$$

Figure 7:
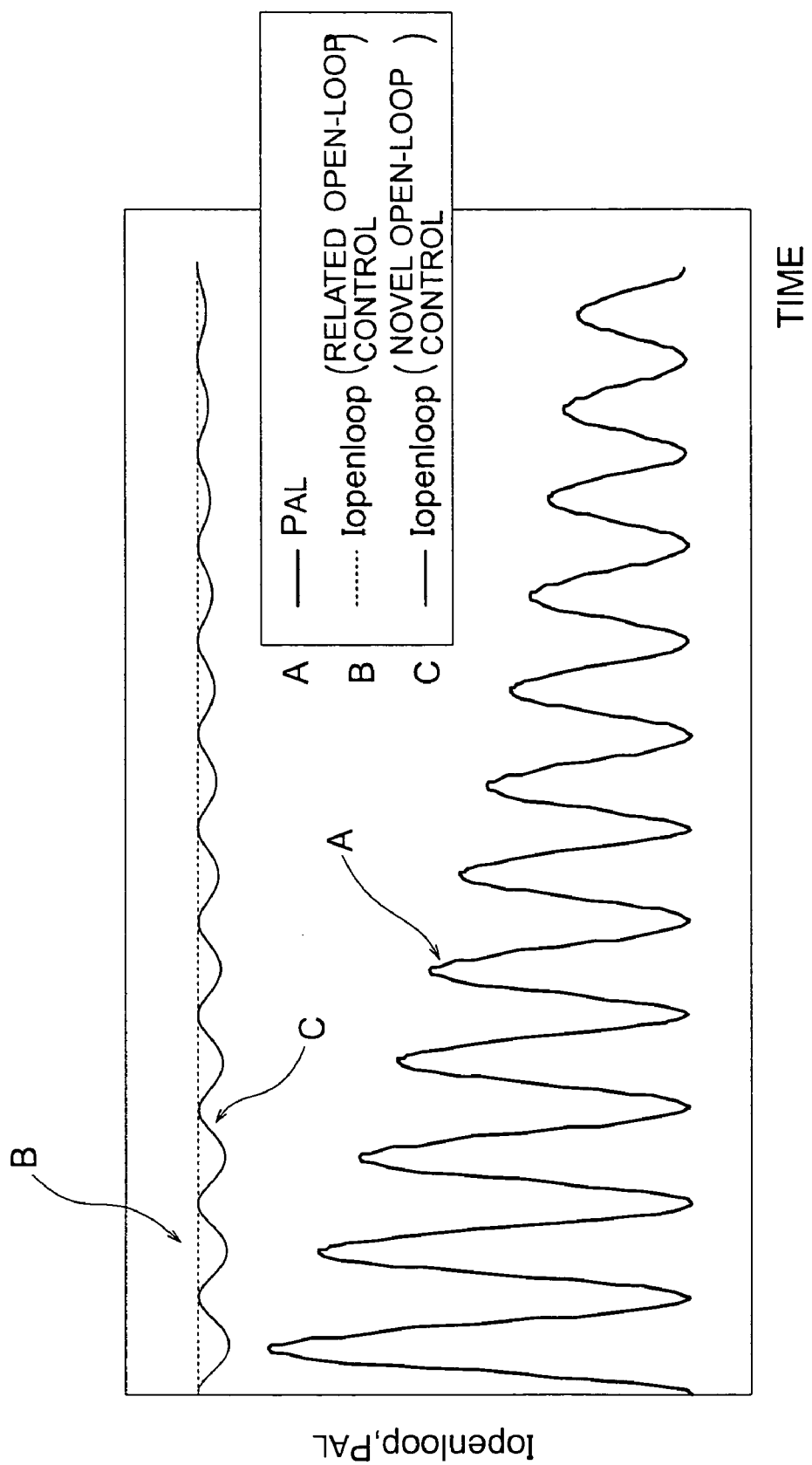
FIG. 7 is a graph for illustrating an influence of a beam line effect on open-loop dose control in an ion implanter.

This beam current $I_{openloop}$ is a beam current used in the novel open-loop control. In this case, the beam current $I_{openloop}$ is not constant and is to be decreased when the pressure $P_{AL}$ is increased. In FIG. 7, capital letters A, B and C represent changes with time of the pressure $P_{AL}$, a beam current $I_{openloop}$ in a related implanter, and a beam current $I_{openloop}$ of the example of the present invention, respectively.

Figure 8A:
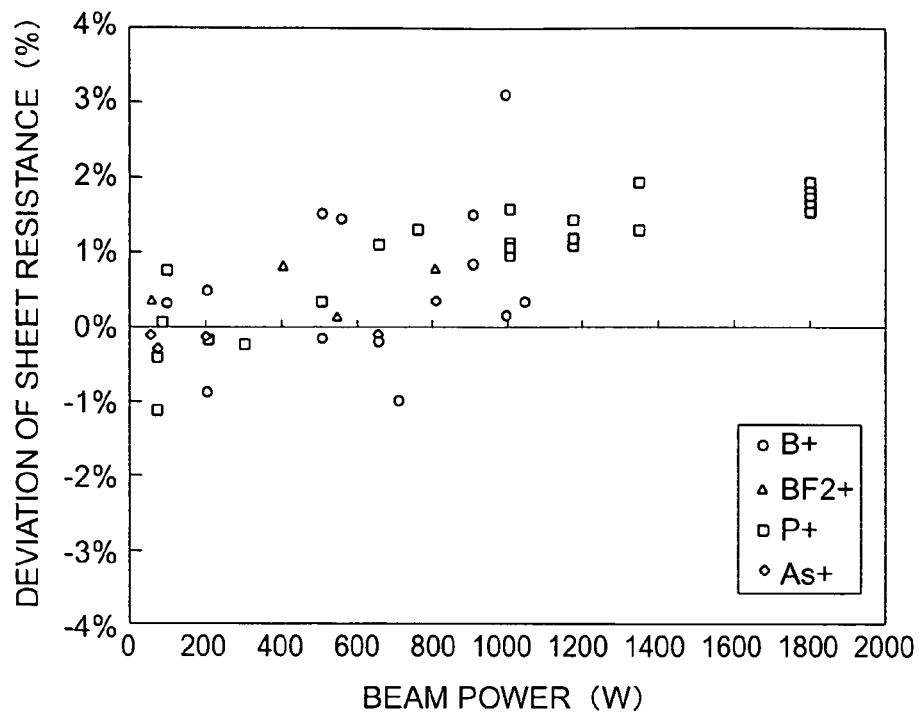
Figure 8B:
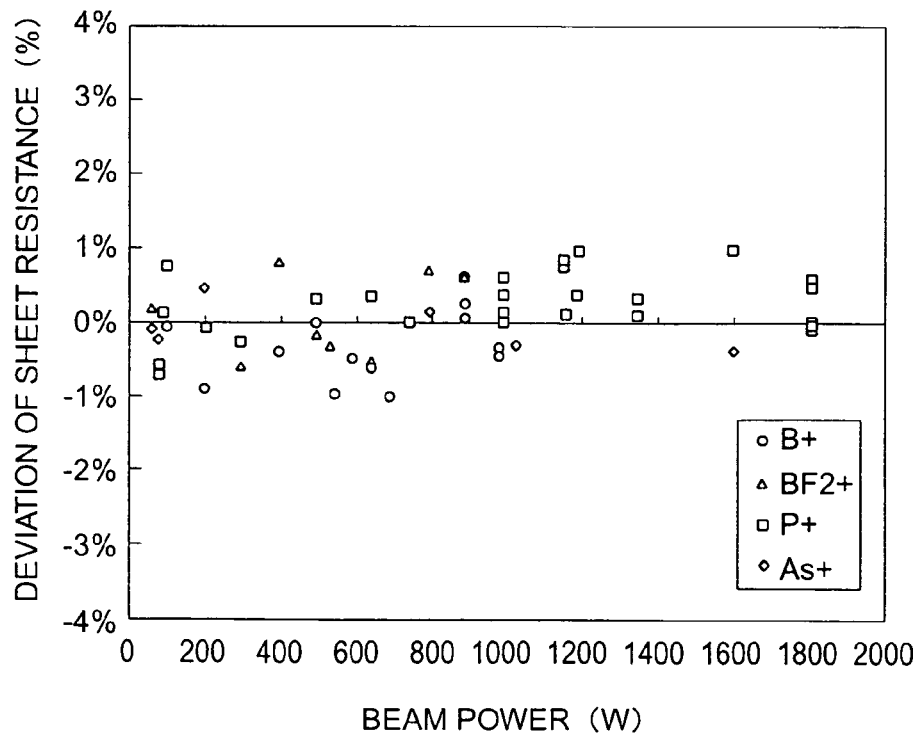

The accuracy of the dose control obtained when the beam line effect is not taken into consideration is shown in FIG. 8A and that when the beam line effect is taken into consideration is shown in FIG. 8B. FIG. 8A shows the results of sheet resistance obtained when a related $P_{comp}$ mechanism is used. FIG. 8B shows the results of sheet resistance when the beam line effect is taken into consideration according to the present invention. In both cases shown in FIGS. 8A and 8B, sheet resistance is used as a standard value which is obtained when ion implantation is performed using bare wafers as a dummy wafer, and the results shown in the figures indicate the deviation of sheet resistance from the standard value, in which the sheet resistance is obtained when the ion implantation is performed for wafers provided with a photoresist.

In the case shown in FIG. 8A, it is found that the sheet resistance tends to increase as the beam power is increased. The reason for this is that the amount of photoresist outgas is increased as the beam power is increased, and as a result, the beam line effect becomes more significant.

On the other hand, in the case shown in FIG. 8B, since the beam line effect is corrected, the deviation of the sheet resistance from the standard value is suppressed in the entire range of the beam power. When actually calculated based on the dose measurement in a related ion implanter, the factor α was approximately 0.09 to 0.15.

Next, the above (II) will be described.

Figure 9A:
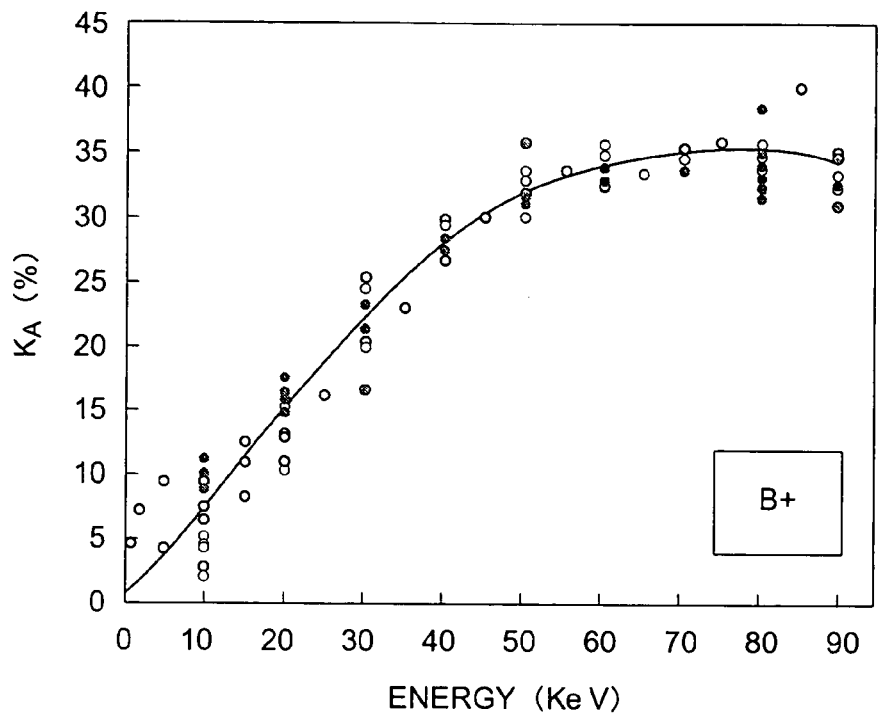
FIGS. 9A and 9B are graphs for illustrating the energy dependence of a pressure compensation factors $K_A$ (shown in FIG. 9A) and K (shown in FIG. 9B)
Figure 9B:
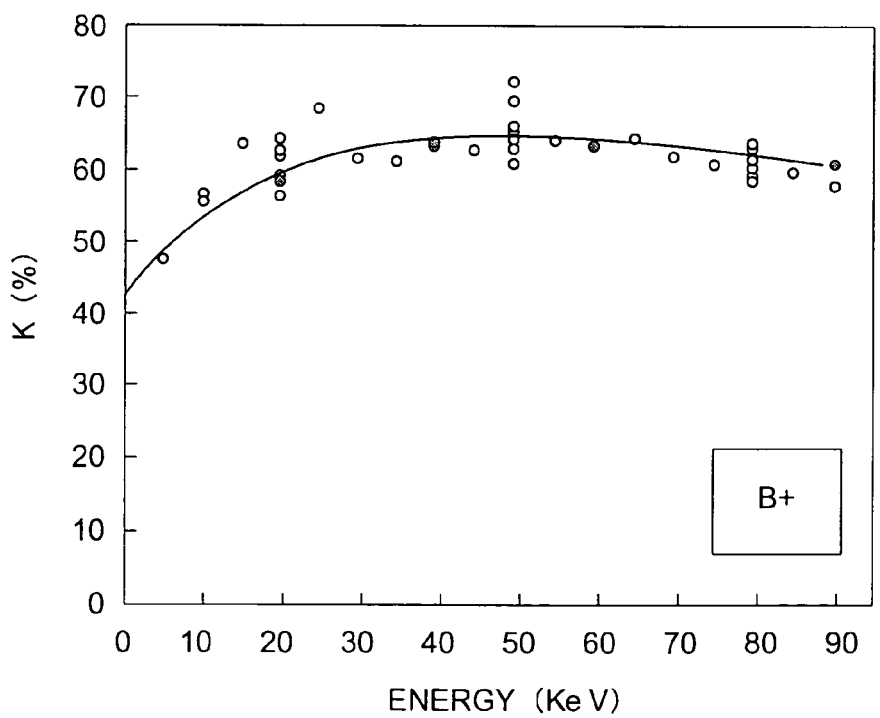

(II) Configuration of Automatic Setting System of Pressure Compensation Factors $K_A$ and K FIG. 9A shows, for example, the ion species/energy dependence of the pressure compensation factors $K_{A+}$ obtained when the beam current is assumed constant in a related ion implanter, and FIG. 9B shows, for example, the ion species/energy dependence of the pressure compensation factors K. The factors are obtained when the beam current is assumed constant in a related ion implanter.

The pressure compensation factors $K_A$ and K for $B^+$ obtained from more than several tens of ion implanters are each multiplied by a constant value specific for each ion implanter so that the difference of $K_A$ or K among the ion implanters is minimized, and subsequently, the values thus obtained were plotted. The absolute values of the factors $K_A$ and K described above are each different from ion implanter to ion implanter, however, the tendency of the change is equivalent to each other, and the relative deviation thereof is sufficiently small. The primary reason that the absolute values differ among ion implanters is believed that the conductance, which depends on constituent elements in the vacuum chamber, and the performances of the vacuum pumps are different among ion implanters.

The adjustment of the difference among the ion implanters can be performed by storing a table of the pressure compensation factors $K_A$ and K in a work station 16 as the standard values, followed by multiplication thereof by a constant. The constant (hereinafter referred to as a "machine factor") used in this case can be obtained by comparing the standard values of the pressure compensation factors $K_A$ and K to the measured values of the pressure compensation factors $K_A$ and K of an ion implanter to be adjusted, in which the standard and the measured values are obtained under a predetermined implantation condition. That is, in the ion implanter to be adjusted, preliminary implantation is first performed before actual implantation for calculating the pressure compensation factors $K_A$ and K. Subsequently, in the work station 16, the calculation of the pressure compensation factors $K_A$ and K is performed, and when the values thus calculated and the standard values of the pressure compensation factors $K_A$ and K are compared to each other, the machine factor can be obtained.

(machine factor of $K_A$)=(measured value of $K_A$)/(standard value of $K_A$)

(machine factor of $K$)=(measured value of $K$)/(standard value of $K$) \quad (22)

Figure 10:
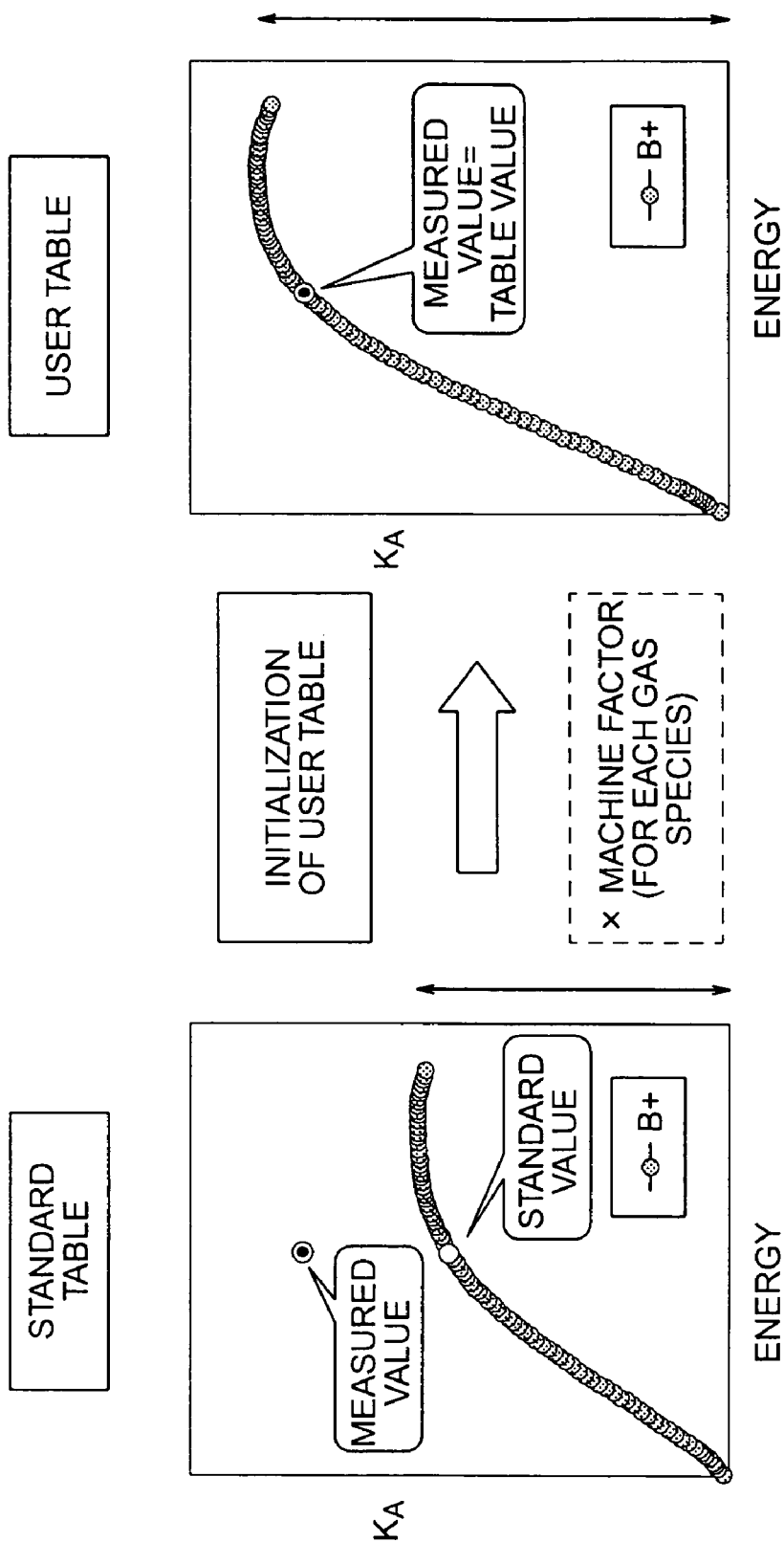
FIG. 10 includes graphs for illustrating adjustment of pressure compensation factors $K_A$ and K in consideration of a machine factor.

As shown in FIG. 10, by multiplying the machine factors thus obtained and the standard values (hereinafter referred to as "initialization"), all the pressure compensation factors $K_A$ and K of the ion implanter to be adjusted are obtained.

In addition, since the beam current dependence of the pressure compensation factors K is observed from the measured value, the value for correction is introduced. Accordingly, the dependence described above is represented by the following equation (23).

$$K(I_{beam}=x \text{ mA})=K_{table} \cdot exp\ [\beta \cdot (10 \text{ mA}-I_{beam})] \quad (23)$$

In this equation, $K(I_{beam}=x$ mA) indicates a K value at a beam current of x (mA), $I_{beam}$ is a beam current set in accordance with a recipe, and $K_{table}$ is a K value set in an initialized user table stored in the work station 16. A factor β is calculated from the measured value and ranges from 0 to 0.025 ($mA^{-1}$) for each ion species.

In the present invention, the individual parameters, $K_A$, K, α, and β, used for the $P_{comp}$ mechanism are stored beforehand as variables for the implantation condition in a memory unit of the work station 16. When an operator of an ion implanter selects an implantation condition and carries out the implantation, the parameters, $K_A$, K, α, and β, corresponding to the implantation condition are read out from the memory unit of the work station 16 and are used for the $P_{comp}$ mechanism.

By the two improvements (I) and (II) described above, when the condition is selected and ion implantation is then performed, the individual parameters, $K_A$, K, α, and β, used for the $P_{comp}$ mechanism are automatically read out from the work station 16 in accordance with the implantation condition and are then provided in the dose controller 14. Accordingly, more accurate dose control can be more easily performed. In addition, the operations become unnecessary in which the pressure compensation factors $K_A$ and K are calculated for each implantation condition and are provided in the controller.

The preferred embodiments of the present invention are described above; however, the present invention is not limited thereto, and the following various modification may also be made without departing from the spirit and the scope of the present invention.

The present invention is applied to an ion implanter comprising a current detector measuring a beam current at the rear side of a disc holding wafers as a measured beam current while the disc is rotated, a pressure detector measuring a vacuum pressure in the vicinity of the wafers, and a vacuum pressure compensation mechanism. In the pressure compensation mechanism, the measured beam currents and the measured vacuum pressures in the vicinity of the wafers are sampled under a plurality of conditions in preliminary implantation, and in addition, after function parameters are calculated by fitting the relationship between the measured beam currents and the measured vacuum pressures thus sampled to a predetermined function, the function parameters thus obtained are stored in a memory unit. In addition, the pressure compensation mechanism corrects the measured beam current in actual implantation using the function parameters stored as functions of the vacuum pressures in the vicinity of the wafers, and based on the beam current thus corrected, the dose control is performed.

According to a first modification of the control method of the present invention, in the ion implanter described above, an actual beam loss is compensated for based on the estimation from the pressure measured in the vicinity of the wafers in a region downstream of a mass analysis slit. The actual beam loss is caused by a pressure increase of a beam line inside a mass analysis magnet apparatus in a beam deflection and travel zone from an inlet of the mass analysis magnet apparatus to a mass analysis slit.

According to a first modification of the ion implanter of the present invention, in the ion implanter described above, it is configured so that an actual beam loss is compensated for based on the estimation from the pressure measured in the vicinity of the wafers in a region downstream of a mass analysis slit, in which the actual beam loss is caused by a pressure increase of a beam line inside a mass analysis magnet apparatus in a beam deflection and travel zone from an inlet of the mass analysis magnet apparatus to a mass analysis slit.

According to a second modification of the control method of the present invention, in the ion implanter described above, an actual beam loss is compensated for by a measured pressure of a beam line inside a mass analysis magnet apparatus in a beam deflection and travel zone, in which the actual beam loss is caused by a pressure increase of the beam line inside the mass analysis magnet apparatus in the beam deflection and travel zone from an inlet of the mass analysis magnet apparatus to a mass analysis slit.

According to a second modification of the ion implanter of the present invention, in the ion implanter described above, it is configured so that an actual beam loss is compensated for by a measured pressure of a beam line inside a mass analysis magnet apparatus in a beam deflection and travel zone, in which the actual beam loss is caused by a pressure increase of the beam line inside the mass analysis magnet apparatus in the beam deflection and travel zone from an inlet of the mass analysis magnet apparatus to a mass analysis slit.

According to a third modification of the control method of the present invention, in the ion implanter described above, an actual beam loss is compensated for by the analysis of a measured pressure at an optional position in a beam line, in which the actual beam loss is caused by a pressure increase of the beam line inside the mass analysis magnet apparatus in the beam deflection and travel zone from an inlet of the mass analysis magnet apparatus to a mass analysis slit.

According to a third modification of the ion implanter of the present invention, in the ion implanter described above, it is configured so that an actual beam loss is compensated for by the analysis of a measured pressure at an optional position in a beam line, in which the actual beam loss is caused by a pressure increase of the beam line inside the mass analysis magnet apparatus in the beam deflection and travel zone from an inlet of the mass analysis magnet apparatus to a mass analysis slit.

According to a fourth modification of the control method of the present invention, in the ion implanter described above, pressure compensation factors for a plasma shower gas are always stored in a memory unit as table values and are automatically read out in accordance with an implantation condition.

According to a fourth modification of the ion implanter of the present invention, the vacuum pressure compensation mechanism is configured so that pressure compensation factors for a plasma shower gas are always stored in a memory unit as table values and are automatically read out in accordance with an implantation condition.

According to a fifth modification of the control method of the present invention, in the ion implanter described above, pressure compensation factors for photoresist outgases are always stored in a memory unit as table values and are automatically read out in accordance with an implantation condition.

According to a fifth modification of the ion implanter of the present invention, the vacuum pressure compensation mechanism is configured so that pressure compensation factors for photoresist outgases are always stored in a memory unit as table values and are automatically read out in accordance with an implantation condition.

According to a sixth modification of the control method of the present invention, in the ion implanter described above, pressure compensation factors for a plasma shower gas and photoresist outgases are always stored in a memory unit as table values and are automatically read out in accordance with an implantation condition.

According to a sixth modification of the ion implanter of the present invention, the vacuum pressure compensation mechanism is configured so that pressure compensation factors for a plasma shower gas and photoresist outgases are always stored in a memory unit as table values and are automatically read out in accordance with an implantation condition.

According to the fourth to sixth modifications of the control method of the present invention, when standard values of the pressure compensation factors for the plasma shower gas and the photoresist outgases stored as the table values are prepared, and the difference in pressure compensation factor caused by individual variation of a plurality of the ion implanters is adjusted, the table values of the pressure compensation factors for the individual ion implanters can be prepared.

According to the first modification of the control method of the present invention, a factor $\alpha$ may always be stored as a table value in a memory unit and may be automatically read out in accordance with an implantation condition, which factor $\alpha$ reflects the actual beam loss caused by the pressure increase of the beam line inside the mass analysis magnet apparatus in the beam deflection and travel zone from the inlet of the mass analysis magnet apparatus to the mass analysis slit.

According to the fifth and sixth modifications of the control method of the present invention, a factor $\beta$ may always be stored as a table value in a memory unit and may be automatically read out in accordance with the implantation condition, which factor $\beta$ adjusts the pressure compensation factor for the photoresist outgas depending on the beam current.

According to the first to third modifications of the control method of the present invention, the pressure measurement may be performed by the steps of measuring the pressure in the vicinity of the wafers and the pressure increase inside the mass analysis magnet apparatus at a plurality of places, and calculating the weighted average in consideration of the conductance of the vacuum chambers and the exhaust speed of the vacuum pumps.

According to the first to third modifications of the control method of the present invention, the disc may have a plurality of slits so that the beam current is measured at least twice per one rotation of the disc.

According to the first to third modifications of the control method of the present invention, the disc may have at least one slit so that the beam current is measured once per one rotation of the disc.

According to the first to third modifications of the control method of the present invention, the disc may have at least one slit so that the beam current is measured once per more than one rotation of the disc. Hence, the sampling intervals can be increased.

According to the fourth to six modifications of the control method of the present invention, simulation may be performed in consideration of the conductance of the entire vacuum chambers of the ion implanter and the exhaust speed of the vacuum pumps for calculating individual variation of the table values of the pressure compensation factors of a plurality of the ion implanters.

According to the fourth to six modifications of the control method of the present invention, factors for adjusting the influences of other parameters of the implantation condition on the pressure compensation factor may be prepared as a plurality of tables, which other parameters include a beam diameter, a beam current density, a total dosage, and an implanting energy, so that the pressure compensation factor is corrected with reference to the plurality of tables as related data before implantation is carried out.

According to the fourth to six modifications of the control method of the present invention, factors for adjusting the influences of conditions of a photoresist on the pressure compensation factor may be prepared as a plurality of tables, which conditions of a photoresist include a material, a solvent and the content thereof, and treatment before implantation, so that the pressure compensation factor is corrected with reference to the plurality of tables as related data before implantation is carried out.

According to the related $P_{comp}$ mechanism, the following first and second problems have been present. The first problem is that since the beam loss inside the mass analysis magnet apparatus in the beam deflection zone from the inlet thereof to the mass analysis slit has not been taken into account, an underdose phenomenon in considerable amount occurs when ion implantation is performed for wafers provided with a photoresist. The second problem is that since the calculation of the pressure compensation factor must be performed for each implantation condition and for each ion implanter, when the implantation condition is variously changed, the operation for calculation becomes complicated.

According to the present invention, the first problem can be overcome since the beam loss inside the mass analysis magnet apparatus is taken into consideration, and as a result, the dose control can be more accurately performed.

According to the present invention, as for the second problem, when the initialization of the table of the pressure compensation factors is only performed after simple preliminary implantation and calculation of the pressure compensation factors are performed, the pressure compensation factors can be automatically selected in accordance with implantation conditions. Hence, according to the present invention described above, a simpler and more accurate $P_{comp}$ mechanism can be realized.

While this invention has thus far been described in conjunction with the preferred embodiment thereof, it will be readily possible for those skilled in the art to put this invention into practice in various other manners without departing from the scope set forth in the appended claims.

What is claimed is:

1. A method for controlling an ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current, the method comprising:

performing secondary compensation for an actual beam loss based on the estimation from the pressure measured in the vicinity of the position at which the wafers are irradiated with the ion beam in a region downstream of the mass analysis slit, the actual beam loss being caused by a pressure increase of a beam line inside the mass analysis magnet apparatus in a beam deflection and travel zone from an inlet of the mass analysis magnet apparatus to the mass analysis slit.

2. An ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current, wherein the vacuum pressure compensation mechanism performs secondary compensation for an actual beam loss based on the estimation from the pressure measured in the vicinity of the position at which the wafers are irradiated with the ion beam in a region downstream of the mass analysis slit, the actual beam loss being caused by a pressure increase of a beam line inside the mass analysis magnet apparatus in a beam deflection and travel zone from an inlet of the mass analysis magnet apparatus to the mass analysis slit.

3. A method for controlling an ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current, the method comprising:
performing secondary compensation for an actual beam loss by a measured pressure of a beam line inside the mass analysis magnet apparatus in a beam deflection and travel zone, the actual beam loss being caused by a pressure increase of the beam line inside the mass analysis magnet apparatus in the beam deflection and travel zone from an inlet of the mass analysis magnet apparatus to the mass analysis slit.

4. An ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current,
wherein the vacuum pressure compensation mechanism performs secondary compensation for an actual beam loss by a measured pressure of a beam line inside the mass analysis magnet apparatus in a beam deflection and travel zone, the actual beam loss being caused by a pressure increase of the beam line inside the mass analysis magnet apparatus in the beam deflection and travel zone from an inlet of the mass analysis magnet apparatus to the mass analysis slit.

5. A method for controlling an ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current, the method comprising:
performing secondary compensation for an actual beam loss by the analysis of a measured pressure of a beam line between the ion source and the wafers in a beam travel zone, the actual beam loss being caused by a pressure increase of the beam line inside the mass analysis magnet apparatus in the beam deflection and travel zone from an inlet of the mass analysis magnet apparatus to the mass analysis slit.

6. An ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current,
wherein the vacuum pressure compensation mechanism performs secondary compensation for an actual beam loss by the analysis of a measured pressure of a beam line between the ion source and the wafers in a beam travel zone, the actual beam loss being caused by a pressure increase of the beam line inside the mass analysis magnet apparatus in the beam deflection and travel zone from an inlet of the mass analysis magnet apparatus to the mass analysis slit.

7. A method for controlling an ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current, the method comprising:

always storing at least one pressure compensation factor for a plasma shower gas in a memory unit as a table value, and automatically reading the pressure compensation factor in accordance with an implantation condition.

8. An ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current, wherein the vacuum pressure compensation mechanism always stores at least one pressure compensation factor for a plasma shower gas in a memory unit as a table value, and automatically reads the pressure compensation factor in accordance with an implantation condition.

9. A method for controlling an ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current, the method comprising:

always storing at least one pressure compensation factor for a photoresist outgas in a memory unit as a table value, and automatically reading the pressure compensation factor in accordance with an implantation condition.

10. An ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current, wherein the vacuum pressure compensation mechanism always stores at least one pressure compensation factor for a photoresist outgas in a memory unit as a table value, and automatically reads the pressure compensation factor in accordance with an implantation condition.

11. A method for controlling an ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current, the method comprising:

always storing pressure compensation factors for a plasma shower gas and a photoresist outgas in a memory unit as table values, and automatically reading the pressure compensation factors in accordance with an implantation condition.

12. An ion implanter which performs ion implantation by irradiating wafers on a disc disposed in a vacuum processing chamber with an ion beam generated in an ion source through a mass analysis magnet apparatus and a mass analysis slit, the ion implanter having current measurement means measuring at least one beam current at the rear side of the disc in the vacuum processing chamber as a measured beam current while the disc is rotated, pressure measurement means measuring at least one vacuum pressure in the vicinity of a position at which the wafers are irradiated with the ion beam, and a vacuum pressure compensation mechanism having functions of sampling the measured beam currents and the vacuum pressures under a plurality of conditions in preliminary implantation, fitting the relationship between the sampled measured beam currents and vacuum pressures to a predetermined function, storing at least one function parameter obtained by calculation of at least one parameter of the function, correcting the measured beam current using the stored function parameter in actual implantation, and performing dosage control in accordance with the corrected beam current, wherein the vacuum pressure compensation mechanism always stores pressure compensation factors for a plasma shower gas and a photoresist outgas in a memory unit as table values, and automatically reads the pressure compensation factors in accordance with an implantation condition.

13. The method for controlling an ion implanter, according to claim 7, further comprising:

preparing standard values of the pressure compensation factor for the plasma shower gas stored as the table values; and adjusting the difference in pressure compensation factor caused by individual variation of a plurality of said ion implanters so that the table values of the pressure compensation factor for the individual ion implanters are made.

14. The method for controlling an ion implanter, according to claim 9, further comprising:

preparing standard values of the pressure compensation factor for the photoresist outgas stored as the table values; and adjusting the difference in pressure compensation factor caused by individual variation of a plurality of said ion implanters so that table values of the pressure compensation factors for the individual ion implanters are made.

15. The method for controlling an ion implanter, according to claim 11, further comprising:

preparing standard values of the pressure compensation factors to the plasma shower gas and the photoresist outgas stored as the table values; and adjusting the difference in pressure compensation factor caused by individual variation of a plurality of said ion implanters so that the table values of the pressure compensation factors for the individual ion implanters are made.

16. The method for controlling an ion implanter, according to claim 1, further comprising:

always storing a factor $\alpha$ as a table value in a memory unit, the factor $\alpha$ reflecting the actual beam loss caused by the pressure increase of the beam line inside the mass analysis magnet apparatus in the beam deflection and travel zone from the inlet of the mass analysis magnet apparatus to the mass analysis slit; and automatically reading the factor $\alpha$ in accordance with an implantation condition.

17. The method for controlling an ion implanter, according to claim 9 or 11, further comprising:

always storing a factor $\beta$ as a table value in a memory unit, the factor $\beta$ adjusting the pressure compensation factor for the photoresist outgas depending on the beam current; and automatically reading the factor $\beta$ in accordance with the implantation condition.

18. The method for controlling an ion implanter, according to one of claims 1, 3, and 5, wherein the ion implanter further has at least one vacuum chamber and at least one vacuum pump, and the pressure measurement is performed by the steps of measuring the pressure in the vicinity of the position at which the wafers are irradiated with ion beam and the pressure increase inside the mass analysis magnet apparatus at a plurality of places, and calculating the weighted average in consideration of the conductance of the vacuum chamber and the exhaust speed of the vacuum pump.

19. The method for controlling an ion implanter, according to one of claims 1, 3, and 5, wherein the disc has a plurality of slits so that the beam current is measured at least twice per one rotation of the disc.

20. The method for controlling an ion implanter, according to one of claims 1, 3, and 5, wherein the disc has at least one slit so that the beam current is measured once per one rotation of the disc.

21. The method for controlling an ion implanter, according to one of claims 1, 3, and 5, wherein the disc has at least one slit so that the beam current is measured once per more than one rotation of the disc, whereby the sampling interval is increased.

22. The method for controlling an ion implanter, according to one of claims 7, 9, and 11, wherein the ion implanter further has at least one vacuum chamber and at least one vacuum pump, the method further comprising performing simulation in consideration of the conductance of the entire vacuum chamber and the exhaust speed of the vacuum pump so as to calculate individual variation of the table values of the pressure compensation factors of a plurality of said ion implanters.

23. The method for controlling an ion implanter, according to one of claims 7, 9, and 11, further comprising:

preparing factors for adjusting the influences of other parameters of the implantation condition on the pressure compensation factor as a plurality of tables, said other parameters including a beam diameter, a beam current density, a total dosage, and an implanting energy; and correcting the pressure compensation factor with reference to said plurality of tables before implantation is carried out.

24. The method for controlling an ion implanter, according to one of claims 7, 9, and 11, further comprising:

preparing factors for adjusting the influences of conditions of a photoresist on the pressure compensation factor as a plurality of tables, the conditions of a photoresist including a material, a solvent and the content thereof, and treatment before implantation; and correcting the pressure compensation factor with reference to said plurality of tables before implantation is carried out.

* * * * *